United States Patent
Lee et al.

(10) Patent No.: US 11,227,845 B2
(45) Date of Patent: Jan. 18, 2022

(54) POWER MODULE AND METHOD OF MANUFACTURING SAME

(71) Applicants: HYUNDAI MOTOR COMPANY, Seoul (KR); KIA MOTORS CORPORATION, Seoul (KR)

(72) Inventors: Hyun Koo Lee, Goyang-si (KR); Sung Won Park, Incheon (KR); Jun Hee Park, Hwaseong-si (KR); Hyeon Uk Kim, Hwaseong-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 0 days.

(21) Appl. No.: 16/991,293

(22) Filed: Aug. 12, 2020

(65) Prior Publication Data
US 2021/0183795 A1    Jun. 17, 2021

(30) Foreign Application Priority Data

Dec. 16, 2019   (KR) .................. 10-2019-0167718

(51) Int. Cl.
| | | |
|---|---|---|
| H01L 23/64 | (2006.01) | |
| H01L 23/31 | (2006.01) | |
| H01L 23/373 | (2006.01) | |
| H01L 23/495 | (2006.01) | |
| H01L 21/48 | (2006.01) | |
| H01L 21/56 | (2006.01) | |
| H01L 23/00 | (2006.01) | |
| H02P 27/06 | (2006.01) | |

(52) U.S. Cl.
CPC ........ *H01L 23/645* (2013.01); *H01L 21/4825* (2013.01); *H01L 21/4871* (2013.01); *H01L 21/565* (2013.01); *H01L 23/3107* (2013.01); *H01L 23/3735* (2013.01); *H01L 23/4952* (2013.01); *H01L 23/49506* (2013.01); *H01L 23/49562* (2013.01); *H01L 23/49568* (2013.01); *H01L 23/49575* (2013.01); *H01L 24/48* (2013.01); *H01L 2224/48175* (2013.01); *H01L 2924/10253* (2013.01); *H01L 2924/10272* (2013.01); *H01L 2924/13055* (2013.01); *H01L 2924/13091* (2013.01); *H01L 2924/14252* (2013.01); *H01L 2924/30107* (2013.01); *H02P 27/06* (2013.01)

(58) Field of Classification Search
CPC ............... H01L 23/645; H01L 23/3107; H01L 23/3735; H01L 23/49506; H01L 23/4952; H01L 21/4825; H01L 21/4871; H01L 21/565

See application file for complete search history.

(56) References Cited

U.S. PATENT DOCUMENTS

| | | | |
|---|---|---|---|
| 9,293,680 B2 | 3/2016 | Poliquin et al. | |
| 2004/0124539 A1* | 7/2004 | Yang | .......... H01L 23/3128 257/777 |
| 2009/0174044 A1* | 7/2009 | Eom | .......... H01L 21/56 257/675 |
| 2012/0014059 A1* | 1/2012 | Zeng | .......... H01L 24/34 361/690 |

* cited by examiner

*Primary Examiner* — Marc Anthony Armand
(74) *Attorney, Agent, or Firm* — McDonnell Boehnen Hulbert & Berghoff LLP

(57) ABSTRACT

A power module includes a substrate having a dielectric layer, a first power semiconductor device disposed on an upper part of the substrate, and a second power semiconductor device disposed on a lower part of the substrate.

9 Claims, 10 Drawing Sheets

POWER MODULE AND METHOD OF MANUFACTURING SAME

CROSS REFERENCE TO RELATED APPLICATIONS

The present application claims priority to Korean Patent Application No. 10-2019-0167718, filed Dec. 16, 2019, the entire contents of which is incorporated herein for all purposes by this reference.

BACKGROUND

Field

The present disclosure relates to a power module and a method of manufacturing the same and, more particularly, to a power module and a method of manufacturing the same, the power module having a structure in which, a substrate provided with a dielectric layer therebetween is interposed therein, and power semiconductor devices are disposed on upper and lower parts of the substrate, thereby reducing the number of components, simplifying manufacturing processes, and improving performance.

Description of the Related Art

As one of the core parts of hybrid and electric vehicles, a power converter (e.g., inverter) is the main component of an eco-friendly vehicle, and many technical developments of the power converter are underway. Developing a power module, which is the core component of the power converter and costs the most, is a key technology in the field of the eco-friendly vehicle.

Conventionally, the power module has been manufactured in various structures, and in particular, the power module has been manufactured in the form of a single-sided cooling power module and a double-sided cooling power module according to a structure in which cooling fins or cooling channels are disposed to easily discharge heat generated from the power module.

Since the single-sided cooling power module is manufactured including a means for cooling on a single surface of a power semiconductor device such as an insulated-gate bipolar transistor (IGBT), the cooling performance thereof is low, and parasitic inductance is increased due to the current flowing through wire bonding.

In order to eliminate the shortcomings of the single-sided cooling power module, a double-sided cooling power module has been developed. The double-sided cooling power module is provided with substrates on both upper and lower surfaces of the power semiconductor device, and the current flows according to a circuit pattern formed on the substrates.

However, since soldering or sintering for wire bonding the double-sided cooling power module should be performed two or more times in the manufacturing process, reliability is reduced since the solder is remelted due to soldering multiple times. In addition, since the current flows according to the pattern of the substrates disposed on the upper and lower sides of the double-sided cooling power module, the amount of parasitic inductance increases. In addition, since the substrates should be disposed on both the upper and lower sides of the power semiconductor device, bonding wires electrically connecting signal terminals of the power semiconductor device to a lead in between both substrates may cause interference in which the bonding wires are contacted with the substrates. In order to eliminate such interference, a sufficient distance should be maintained between the two substrates, thereby causing a unit price to increase due to disposing an additional spacer at a position between at least one of the substrates and the power semiconductor device.

The foregoing is intended merely to aid in the understanding of the background of the present disclosure, and is not intended to mean that the present disclosure falls within the purview of the related art that is already known to those skilled in the art.

SUMMARY

Accordingly, the present disclosure provides a power module having a structure in which, being interposed a substrate provided with a dielectric layer therebetween, power semiconductor devices are disposed on upper and lower parts of the substrate, thereby eliminating key components of the conventional power modules such as a spacer, and reducing the number times soldering or sintering is performed and the amount of parasitic inductance.

As a means for solving the above technical problem, the present disclosure provides a power module including a substrate having a dielectric layer, a first power semiconductor device disposed on an upper part of the substrate, and a second power semiconductor device disposed on a lower part of the substrate.

An exemplary embodiment of the present disclosure may further include a first lead part disposed on an upper part of the first power semiconductor device and electrically connected to the first power semiconductor device, and a second lead part disposed on a lower part of the second power semiconductor device and electrically connected to the second power semiconductor device.

In the exemplary embodiment of the present disclosure, for receiving direct current voltage, the first lead part and the second lead part may respectively include a first power lead and a second power lead, the first power lead and the second power lead may be disposed to be overlapped with each other up and down, and an insulating layer may be interposed between the first power lead and the second power lead.

In the exemplary embodiment of the present disclosure, a portion of the first lead part and a portion of the second lead part may be interconnected to make an electrical connection between the first power semiconductor device and the second power semiconductor device.

In the exemplary embodiment of the present disclosure, the substrate may be provided with the dielectric layer, a first metal layer provided on an upper surface of the dielectric layer, and a second metal layer provided on a lower surface of the dielectric layer, a portion between the first metal layer and the first power semiconductor device, a portion between the first metal layer and the first lead part, and a portion between the first power semiconductor device and the first lead part may be electrically connected to each other by being soldered, and a portion between the second metal layer and the second power semiconductor device, a portion between the second metal layer and the second lead part, and a portion between the second power semiconductor device and the second lead part may be electrically connected to each other by being soldered.

In the exemplary embodiment of the present disclosure, the first lead part may be provided with a first flat surface protruding upward and the second lead part may be provided with a second flat surface protruding downward.

In the exemplary embodiment of the present disclosure, the power module may further include a mold part integrally covering the substrate, the first power semiconductor device, the second power semiconductor device, a portion of the first lead part, and a part of the second lead part, wherein the first flat surface and the second flat surface may be exposed toward outside from the mold part.

As another means for solving the technical problem, the present disclosure provides a method of manufacturing a power module, the method including providing a substrate having an upper lead frame, a lower lead frame, a first power semiconductor device, a second power semiconductor device, and a dielectric layer, sequentially laminating and bonding the upper lead frame, the first power semiconductor device, the substrate, the second power semiconductor device, and the lower lead frame, wire bonding between a first signal connection lead of the upper lead frame and signal terminals of the first power semiconductor device, and wire bonding between a second signal connection lead of the lower lead frame and signal terminals of the second power semiconductor device, forming a mold part to cover a laminated structure formed through the bonding and a wire bonding part formed through the wire bonding, and separating and removing a predetermined region of the upper lead frame and the lower lead frame to complete the power module.

In the exemplary embodiment of the present disclosure, during bonding, a first power lead included in the upper lead frame and a second power lead included in the lower lead frame may be vertically overlapped with each other, between which direct current voltage may be applied, and an insulating layer may be interposed between the first power lead and the second power lead.

In the exemplary embodiment of the present disclosure, during bonding, a part of the upper lead frame and a part of the lower lead frame may be soldered to make an electrical connection between the first power semiconductor device and the second power semiconductor device.

In the exemplary embodiment of the present disclosure, the mold part may be formed such that at least a part of an upper surface of the upper lead frame and at least a part of a lower surface of the lower lead frame may be exposed.

According to a power module and a method of manufacturing the same, power semiconductor devices are disposed on upper and lower sides of a substrate provided with a dielectric layer, and thus, when the current flows through metal layers of the substrate, the parasitic inductance may be reduced by the dielectric layer disposed between the metal layers.

In addition, according to the power module and the method of manufacturing the same, since two power leads face each other through an insulating layer interposed between the two power leads supplying direct current power to the power module, an effect may also be expected that the parasitic inductance is reduced by the insulating layer.

In addition, according to the power module and the method of manufacturing the same, since the power semiconductor devices are disposed on the upper and lower sides of the substrate, sufficient space may be secured on the upper and lower sides of the power semiconductor device. Therefore, compared with the conventional power module that disposes power semiconductor devices between both substrates, the occurrence of interference between bonding wires and the substrates may be eliminated, and a spacer for securing a distance between the two substrates may be removed.

In addition, in the conventional power module in which power semiconductor devices are disposed between two substrates, the second soldering is required after performing a process of the first soldering and wire bonding, and thus a problem occurs in that reliability is reduced due to remelting of the solder. However, according to the power module and the method of manufacturing the same of the present disclosure, the number times soldering is performed may be reduced to one time, thereby eliminating the reduced reliability due to the remelting of the solder, and reducing the process cost.

The effects of the present disclosure are not limited to the above-mentioned effects, and other objectives that are not mentioned will be clearly understood by those skilled in the art from the following description.

DETAILED DESCRIPTION

Hereinafter, a power module and a method of manufacturing the same according to various exemplary embodiments are described in more detail with reference to the accompanying drawings.

Figure 1:
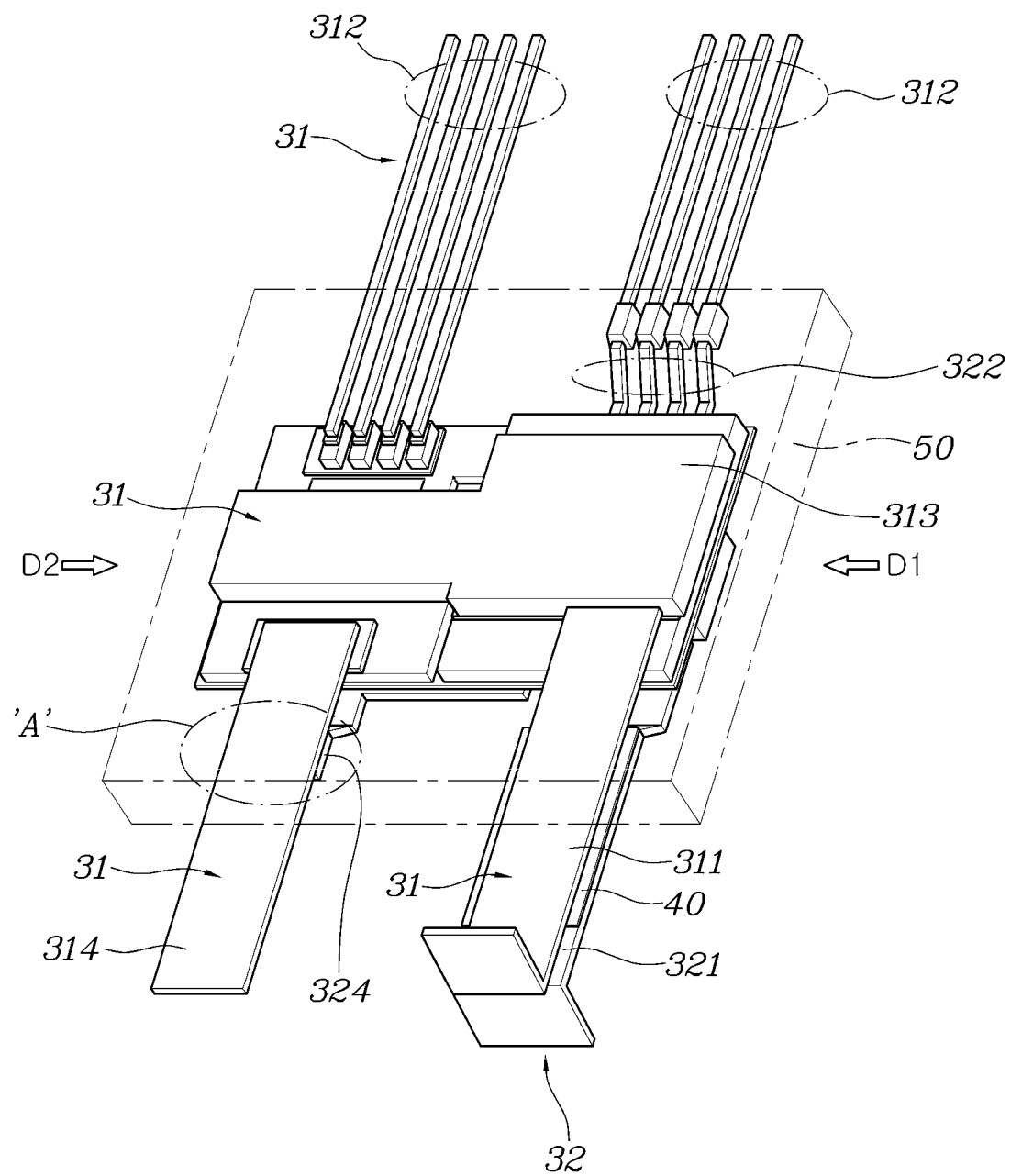
FIG. 1 is a perspective view showing a power module according to an exemplary embodiment of the present disclosure.
Figure 2:
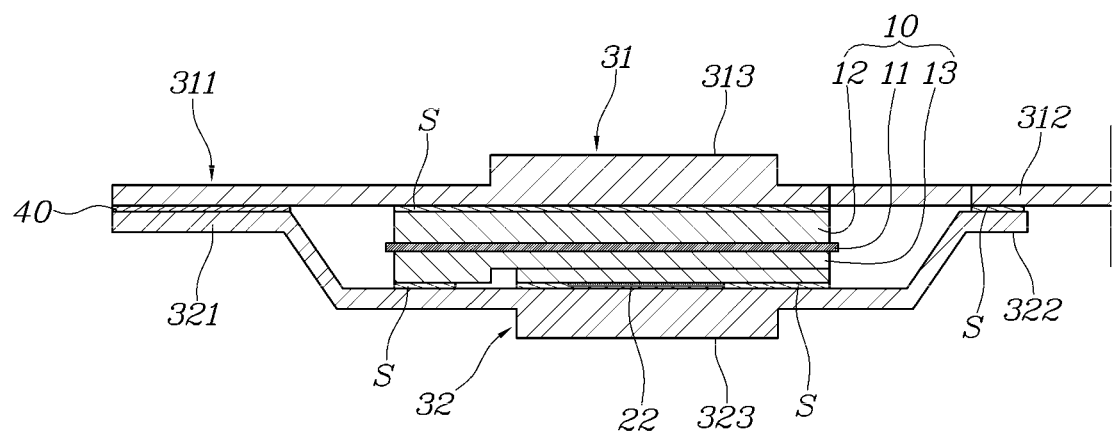
FIG. 2 is a side view of the power module viewed from one direction according to the exemplary embodiment of the present disclosure shown in FIG. 1
Figure 3:
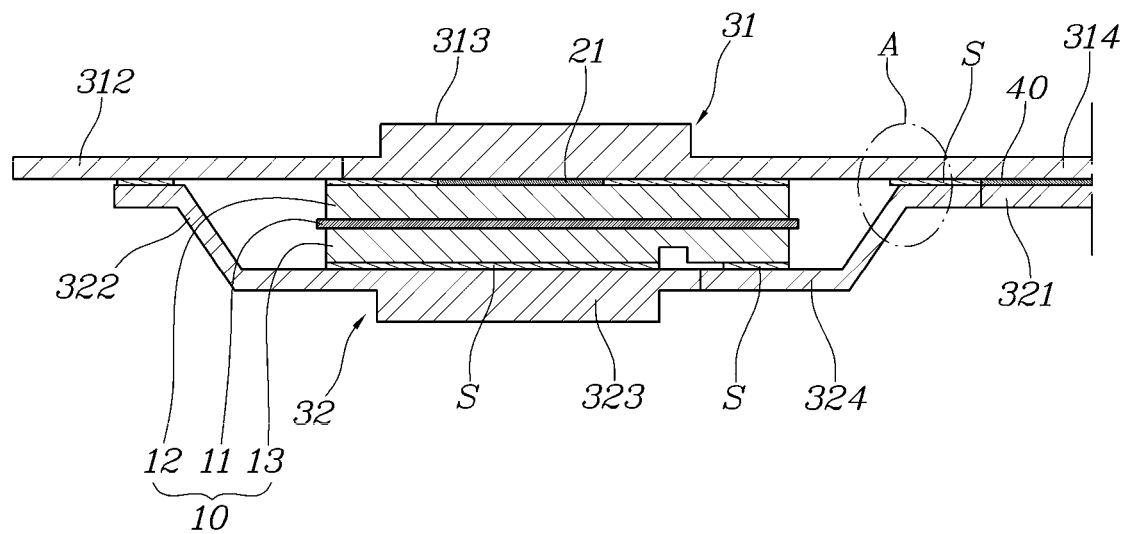
FIG. 3 is a side view of the power module viewed from another direction according to the exemplary embodiment of the present disclosure shown in FIG. 1.

FIG. 1 is a perspective view showing a power module according to an exemplary embodiment of the present disclosure. In addition, FIG. 2 is a side view of the power module viewed in one direction (i.e., D1 direction in FIG. 1) according to the exemplary embodiment of the present disclosure shown in FIG. 1. FIG. 3 is a side view of the power module viewed from another direction (i.e., D2 direction) according to the exemplary embodiment of the present disclosure shown in FIG. 1.

Referring to FIGS. 1 to 3, the power module according to the exemplary embodiment of the present disclosure may include a substrate 10, having a dielectric layer 11, a first power semiconductor device 21 disposed on an upper part of the substrate 10, and a second power semiconductor device 22 disposed on a lower part of the substrate 10.

The substrate 10 may be provided with a double-bonded copper (DBC) substrate having a first metal layer 12 bonded to an upper surface of the dielectric layer 11 and a second metal layer 13 bonded to a lower surface of the dielectric layer 11.

The first power semiconductor device 21 may be soldered on the upper part of the substrate 10 and, more particularly, on the upper surface of the first metal layer 12 of the substrate 10, and may be an IGBT (Insulated Gate Bipolar Transistor) made of Si or SiC material, or may be a MOS- FET (Metal Oxide Semiconductor Field Effect Transistor). The first metal layer 12 of the substrate 10 may be provided with a soldered pattern so as to be electrically connected to current input/output terminals provided on the bottom surface of the first power semiconductor device 21.

Similar to the first power semiconductor device 21, the second power semiconductor device 22 may be soldered on the lower part of the substrate 10 and, more particularly, on the lower surface of the second metal layer 13 of the substrate 10, and may be an IGBT (Insulated Gate Bipolar Transistor) made of Si or SiC material, or may be a MOSFET (Metal Oxide Semiconductor Field Effect Transistor). The second metal layer 13 of the substrate 10 may be provided with a soldered pattern so as to be electrically connected to the current input/output terminals provided on the upper surface of the second power semiconductor device 22.

As described above, by respectively disposing the first power semiconductor device 21 and the second power semiconductor device 22 on the upper and lower surfaces of the substrate 10 being placed in the center therebetween, the power module according to the exemplary embodiment of the present disclosure may reduce the amount of parasitic inductance. In other words, in the conventional power module, parasitic inductance is generated due to the current flow in the substrate, and it is difficult to find a suitable means for reducing the generated parasitic inductance. However, in the various exemplary embodiments of the present disclosure, the power semiconductor devices 21 and 22 are disposed on both the upper and lower sides of the substrate 10 with the dielectric layer 11 interposed therebetween, so that the current flows through the metal layers 12 and 13 on both sides of the dielectric layer 11. Therefore, the parasitic inductance is cancelled through the dielectric layer 11.

The power module according to the exemplary embodiment of the present disclosure may further include a first lead part 31 disposed on an upper portion of the first power semiconductor device 21 and electrically connected to the first power semiconductor device 21, and a second lead part 32 disposed on a lower portion of the second power semiconductor device 22 and electrically connected to the second power semiconductor device 22.

The first lead part 31 may be made of a conductive metal. Through bonding by solder S, a portion of the first lead part 31 may be electrically connected to the current input/output terminals provided at a position on the upper surface of the first power semiconductor device 21.

The second lead part 32 may also be made of a conductive metal. Through bonding by the solder S, a portion of the second lead part 32 may be electrically connected to the current input/output terminals provided at a position on the upper surface of the second power semiconductor device 22.

The first lead part 31 and the second lead part 32 may provide a passage for receiving direct current power input from outside of the power module and for making alternating current power generated by the switching operation of the power semiconductor devices 21 and 22 in the power module to be output to the outside thereof.

For example, the first lead part 31 and the second lead part 32 may include a first power lead 311 and a second power lead 321 to which the direct current voltage from the outside is applied. The first power lead 311 and the second power lead 321 may serve as busbars to which the direct current power from the outside is applied therebetween. Preferably, the first power lead 311 and the second power lead 321 are disposed so as to be overlapped with each other up and down, and may be electrically insulated from each other by interposing an insulating layer 40 between the two power leads 311 and 321. Moreover, the parasitic inductance may be reduced through the insulator layer 40.

In addition, the first lead part 31 and the second lead part 32 may include a third power lead 314 and a fourth power lead 324 for making alternating current generated by the switching operation of the power semiconductor devices 21 and 22 in the power module to output to the motor and for receiving alternating current input from the motor, wherein the third power lead 314 and the fourth power lead 324 may be electrically connected to each other. In FIGS. 1 and 3, an area denoted by A is an area where the third power lead 314 and the fourth power lead 324 are electrically connected to each other, and is an area corresponding to a connection node of the first power semiconductor device 21 and the second power semiconductor device 22 equivalent to two switching devices included in one leg in an inverter structure to which the power module is applied. The area denoted by A is an area where the third power lead 314 of the first lead part 31 and the fourth power lead 324 of the second lead part 32 are bonded to each other by the solder S, so that the power semiconductor device 21 and the second power semiconductor device 22 are electrically connected to each other.

Figure 9:
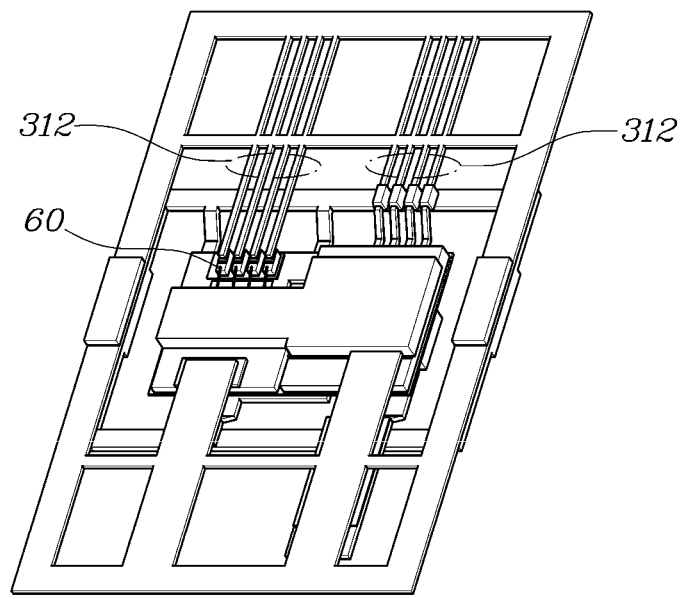
Figure 9:
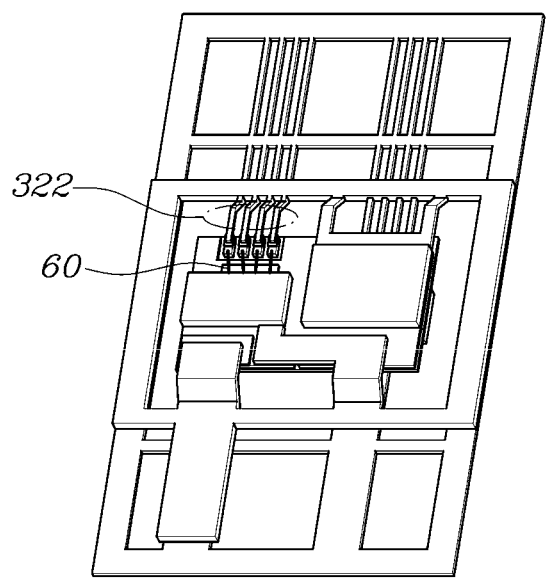

In addition, the first lead part 31 and the second lead part 32 may include signal connection leads 312 and 322 for providing control signals to the first power semiconductor device 21 and the second power semiconductor device 22, wherein an electrical connection may be provided through soldering or sintering between the signal connection leads 312 and 322 as necessary. In the example of FIGS. 1 to 3, the first lead part 31 is provided with a total of eight signal connection leads 312. The four signal connection leads out of the eight are electrically connected to the signal connection lead 322 of the second lead part 32 through soldering or sintering. The remaining four signal connection leads may be connected to the signal terminals of the first power semiconductor device 21 through wire bonding. In addition, one end of the signal connection lead 322 of the second lead part 32 is connected to the signal connection lead 312 of the first lead part 31 through soldering or sintering, and the other end thereof may be connected to the signal terminals of the second power semiconductor device 22 through wire bonding. The wire bonding structure is shown in FIG. 9 for explaining the method of manufacturing the power module according to the various exemplary embodiments of the present disclosure to be described below.

The first lead part 31 and the second lead part 32 may each include a first flat surface 313 protruding upward and a second flat surface 323 protruding downward. The first flat surface 313 and the second flat surface 323 may be provided in regions respectively overlapped with the first power semiconductor device 21 and the second power semiconductor device 22 in a vertical direction, and may be respectively protruding upward and downward, so as to be exposed above and below a mold part 50.

The mold part 50 is a structure formed to surround the power semiconductor devices 21 and 22, the substrate 10, and a part of the lead parts 31 and 32, and is made of an insulating material to protect the structure of the power module. The first flat surface 313 of the first lead part 31 and the second flat surface 323 of the second lead part 32 are exposed to the outside of the mold part 50, thereby being able to facilitate discharging heat generated in the power semiconductor devices 21 and 22 to the outside of the mold part 50. Furthermore, separate cooling channels may be disposed above and below the power module so as to contact the flat surfaces, thereby being able to further improve the cooling effect of the power module.

Figure 4:
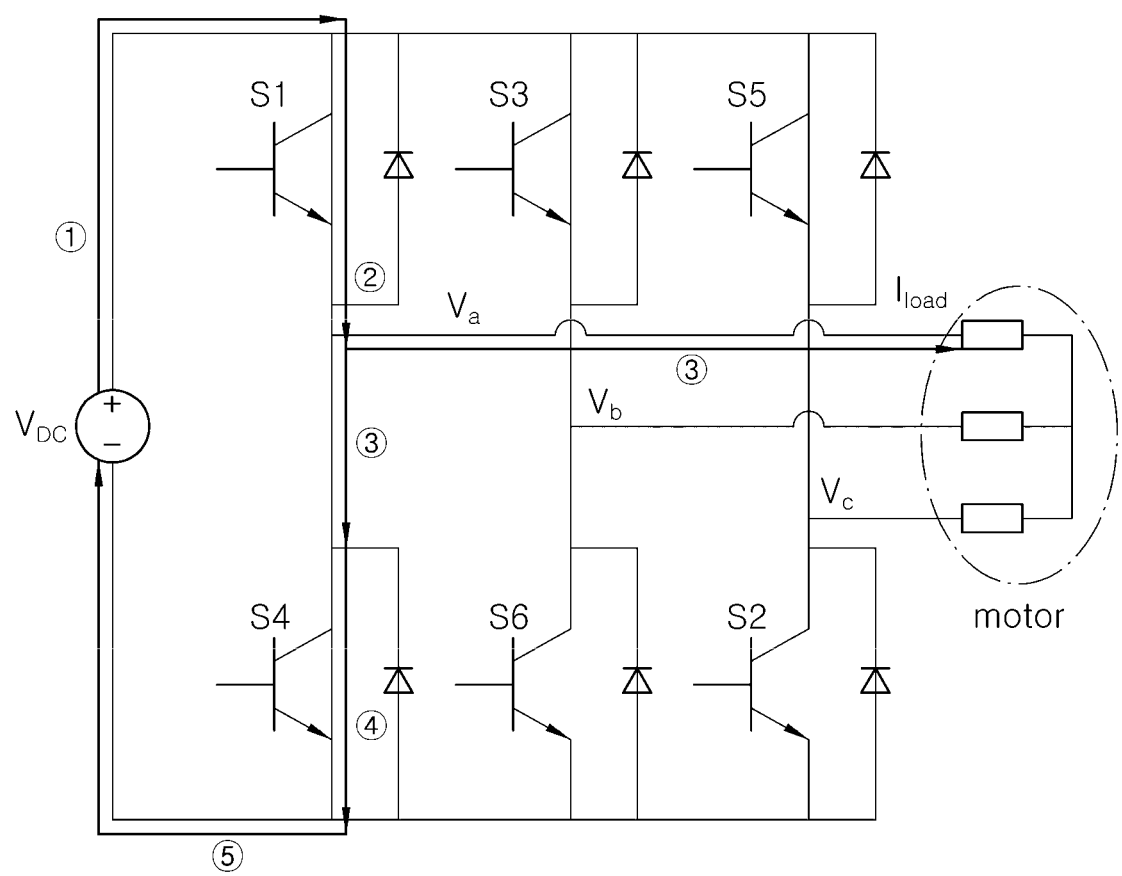
FIGS. 4, 5, and 6 are views of a circuit diagram and perspective diagrams for explaining the current flow in the power module according to the exemplary embodiment of the present disclosure.
Figure 5:
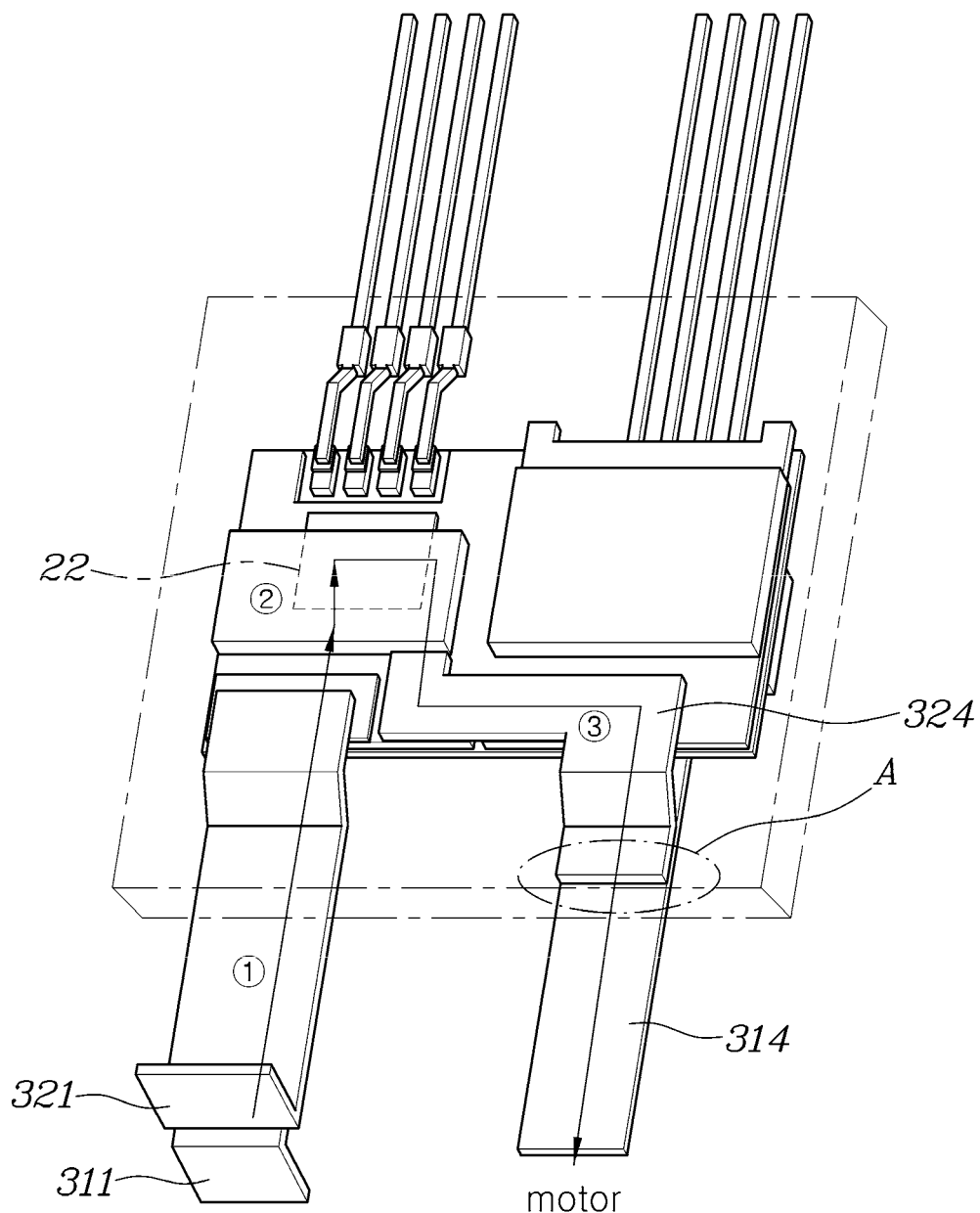
Figure 6:
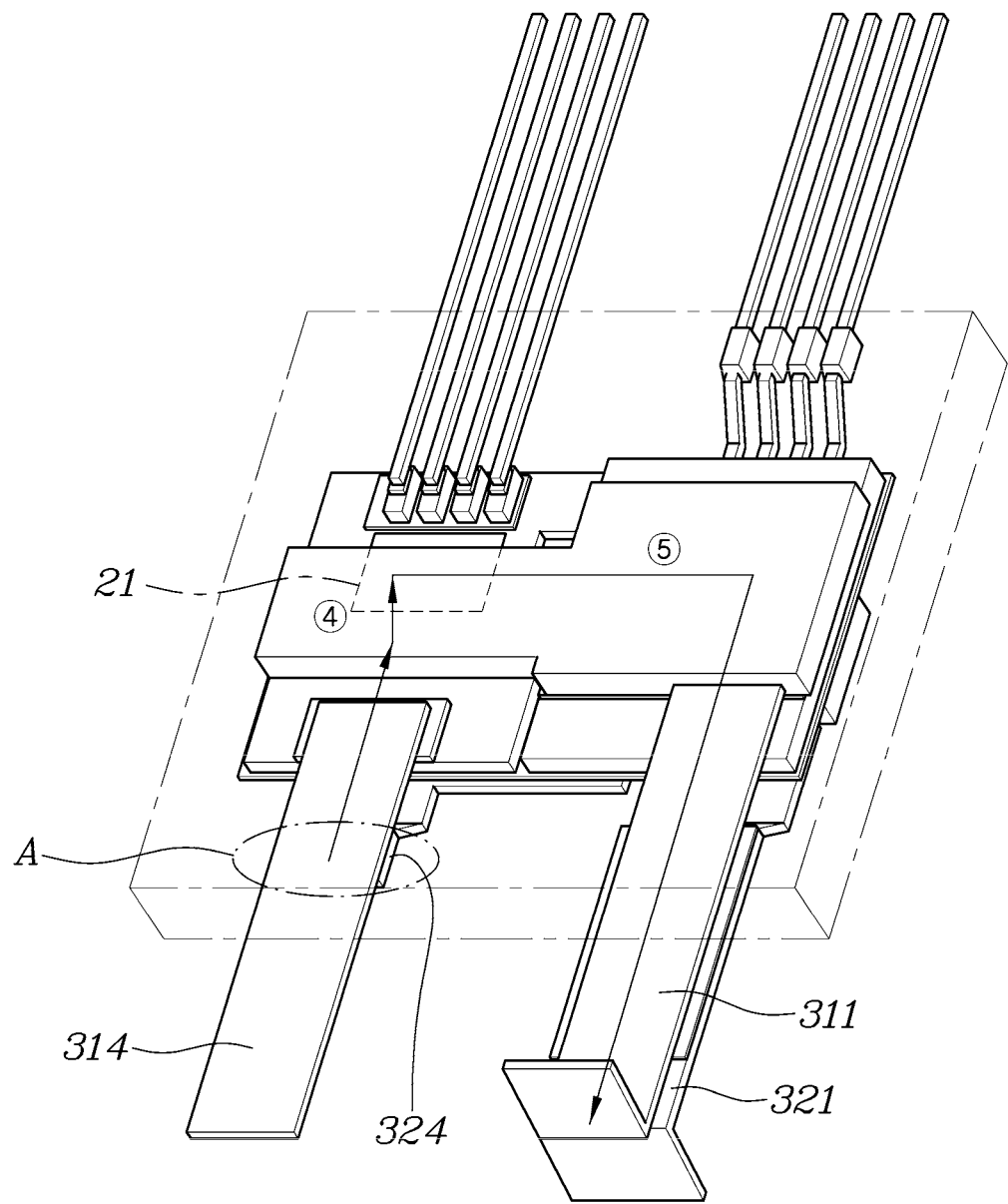

FIGS. 4 to 6 are views of a circuit diagram and perspective diagrams for explaining the current flow in the power module according to the exemplary embodiment of the present disclosure.

The power module according to the exemplary embodiment of the present disclosure may provide a path through which the current flows between the power module and the two switching devices S1 and S4 included in the one leg of the inverter as shown in FIG. 4. The current flow paths shown in FIG. 4 are shown so as to be corresponded to paths on the power module shown in FIGS. 5 and 6.

Referring to FIGS. 4 to 6, when a positive terminal and a negative terminal of direct current voltage ($V_{DC}$) supplied from a power source from outside, such as a battery, are respectively connected to the second power lead 321 of the second lead part 32 and the first power lead 311 of the first lead part 31, the direct current voltage is supplied from the power source to the second power semiconductor device 22 corresponding to the switching device S1 through the second power lead 321 as shown in the path ①. As shown in a path ②, the current passing through the second power semiconductor device 22 is supplied as shown in a path ③ by passing through alternating current output region A connected to the third power lead 314 of the first lead part 31 and the fourth power lead 324 of the second lead part 32. The third power lead 314 and the fourth power lead 324 making the alternating current power output area A may be connected to a motor. The current flowing to the switching device S2 in the alternating current power output region A to which the third power lead 314 and the fourth power lead 324 are connected is supplied to the first power semiconductor device 21 corresponding to the switching device S4 as shown in the path ③. The current passing through the first power semiconductor device 21 as shown in a path ④ flows to the power source through the first power lead 311 as shown in a path ⑤.

FIGS. 7 to 11 are process perspective views showing the method of manufacturing the power module according to the exemplary embodiment of the present disclosure step by step.

Figure 7:
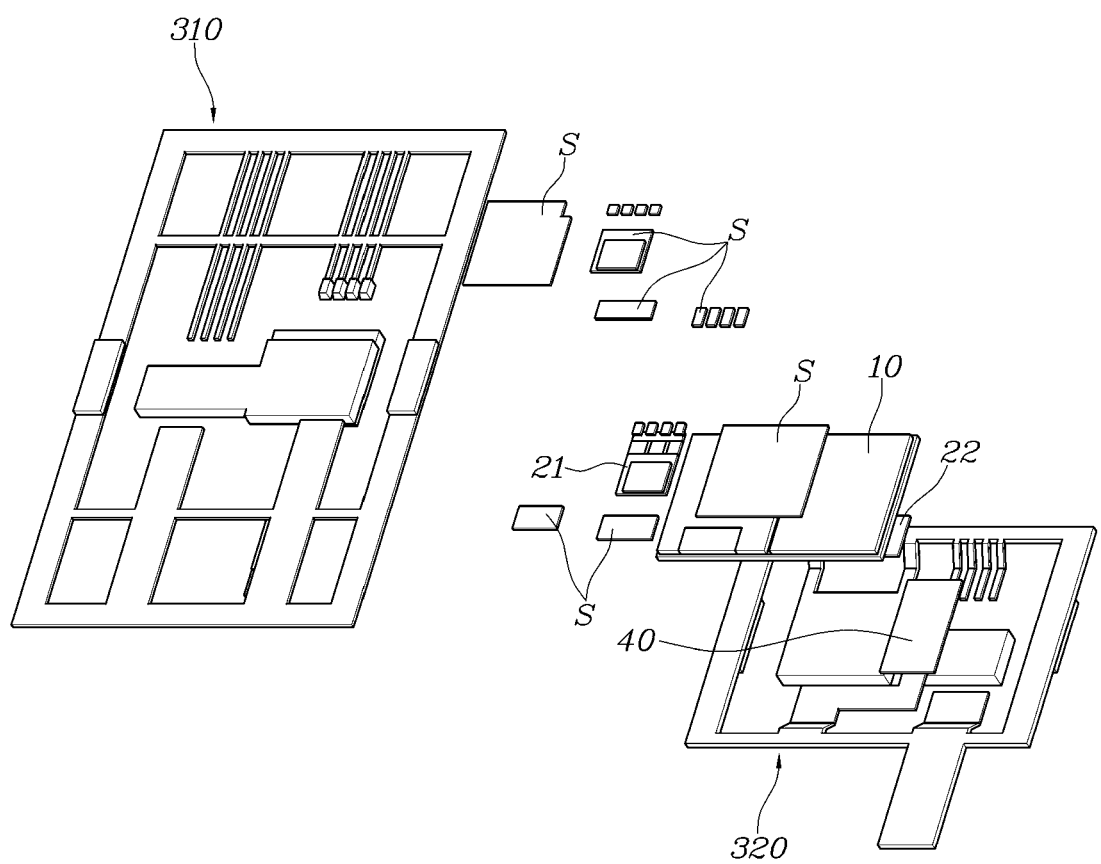
FIGS. 7, 8, 9, 10, and 11 are process perspective views showing the method of manufacturing the power module according to the exemplary embodiment of the present disclosure step by step.

As shown in FIG. 7, the method of manufacturing the power module according to the exemplary embodiment of the present disclosure may be started with preparing the substrate 10 having an upper lead frame 310, a lower lead frame 320, the first power semiconductor device 21, the second power semiconductor device 22, and the dielectric layer. In this step, solder S interposed between parts required an electrical connection may also be provided between the substrate 10 and the power semiconductor devices 21 and 22, between the substrate 10 and the lead frames 310 and 320, or between the lead frames 310 and 320. The insulating layer 40 to be interposed between the first power lead provided in the upper lead frame 310 and the second power lead provided in the lower lead frame 320 may also be provided.

The upper lead frame 310 corresponds to a frame in which the first lead part 31 shown in FIGS. 1 to 3 is disposed in a predetermined structure of arrangement and fixed as the frame. The lower lead frame 320 corresponds to a frame in which the second lead part 32 shown in FIGS. 1 to 3 is disposed in a predetermined structure of arrangement and fixed as the frame.

Figure 8:
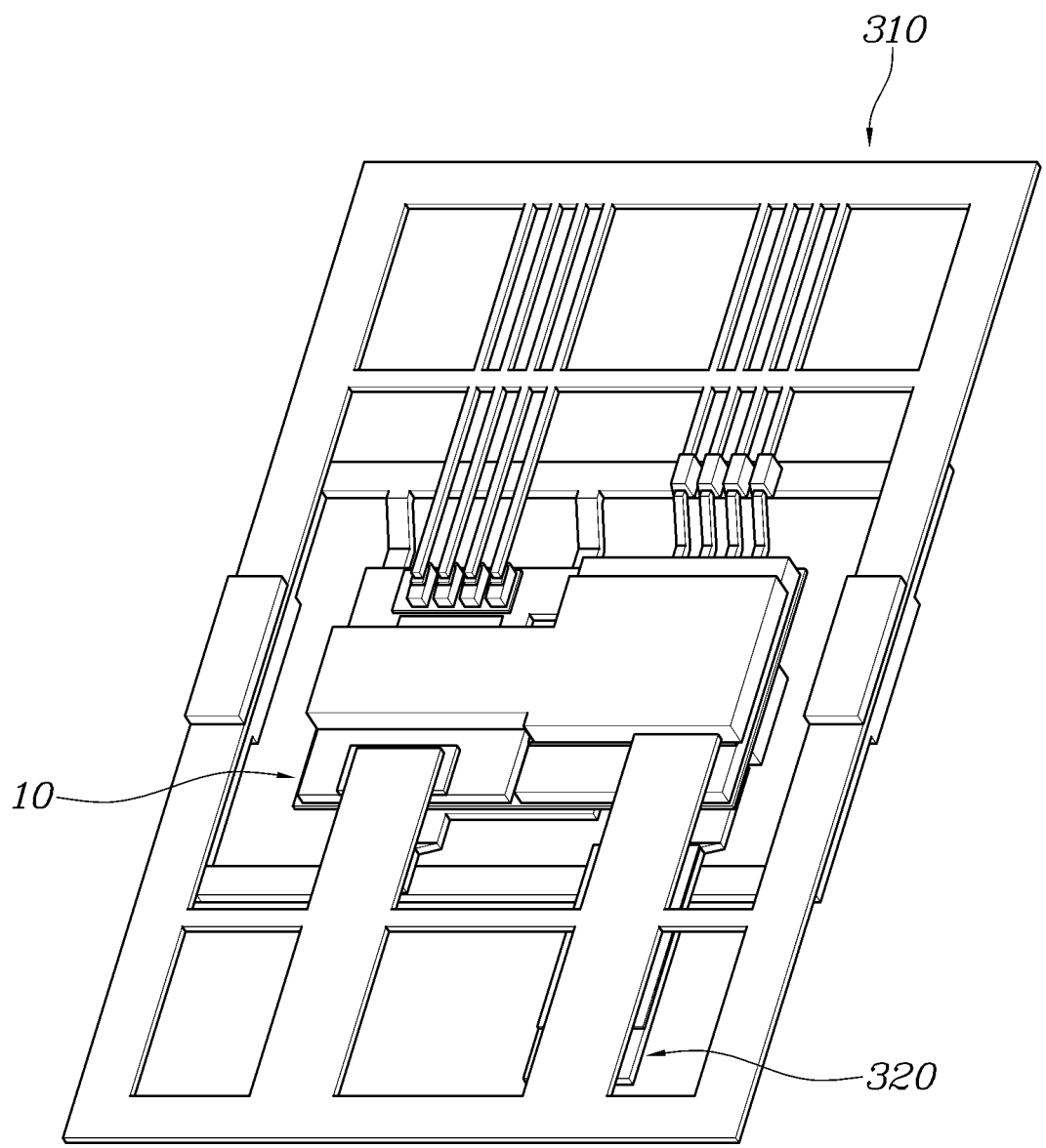

Subsequently, as shown in FIG. 8, the upper lead frame 310, the first power semiconductor device 21, the substrate 10, the second power semiconductor device 22, and the lower lead frame 320 are sequentially laminated and soldered to be bonded, thereby making an electrical connection between each of the elements. In this case, the insulating layer 40 may be disposed between the first power lead and the second power lead so that an upper surface thereof may be contacted with the first power lead and a lower surface thereof may be contacted with the second power lead. When the upper lead frame 310 and the lower lead frame 320 are disposed at a predetermined position, the first power lead and the second power lead may be disposed to be overlapped with each other in the vertical direction, and the insulating layer 40 may be inserted therebetween. FIG. 8 schematically shows a structure of arrangement of the insulating layer 40, but a detailed structure thereof may be easily understood by referring to the structure of arrangement of the insulating layer 40 shown in FIGS. 1 to 3.

In addition, in the soldering shown in FIG. 8, the first and second power semiconductor devices 21 and 22 may be electrically connected to each other by soldering in the interconnection areas denoted by A of FIGS. 1 to 3.

Subsequently, as shown in FIG. 9, a bonding between the first signal connection lead 312 of the upper lead frame 310 and the signal terminals of the first power semiconductor device is performed by using the bonding wire 60. Also, wire bonding between the second signal connection lead 322 of the lower lead frame 320 and the signal terminals of the second power semiconductor device 22 may be performed.

Figure 10:
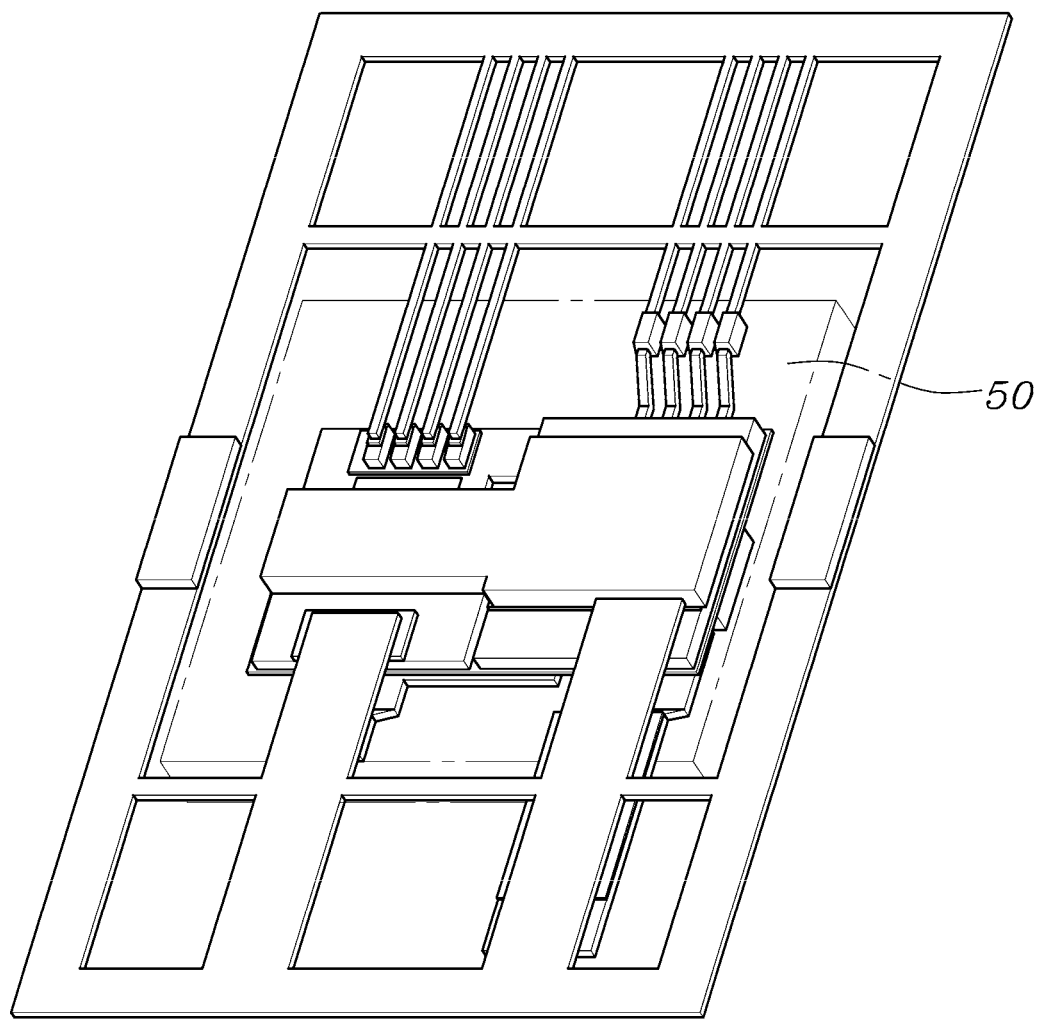

Subsequently, as shown in FIG. 10, the mold part 50 may be formed to cover a laminated structure formed through the soldering of FIG. 8 and the wire bonding part formed through the wire bonding of FIG. 9. In the forming of the mold part shown in FIG. 10, molding techniques known in the art, such as a transfer molding technique, may be applied. In particular, in the forming of the mold part, the mold part 50 may be formed to expose a part of the upper surface of the upper lead frame and a part of the lower surface of the lower lead frame to the outside of the mold part 50.

Figure 11:
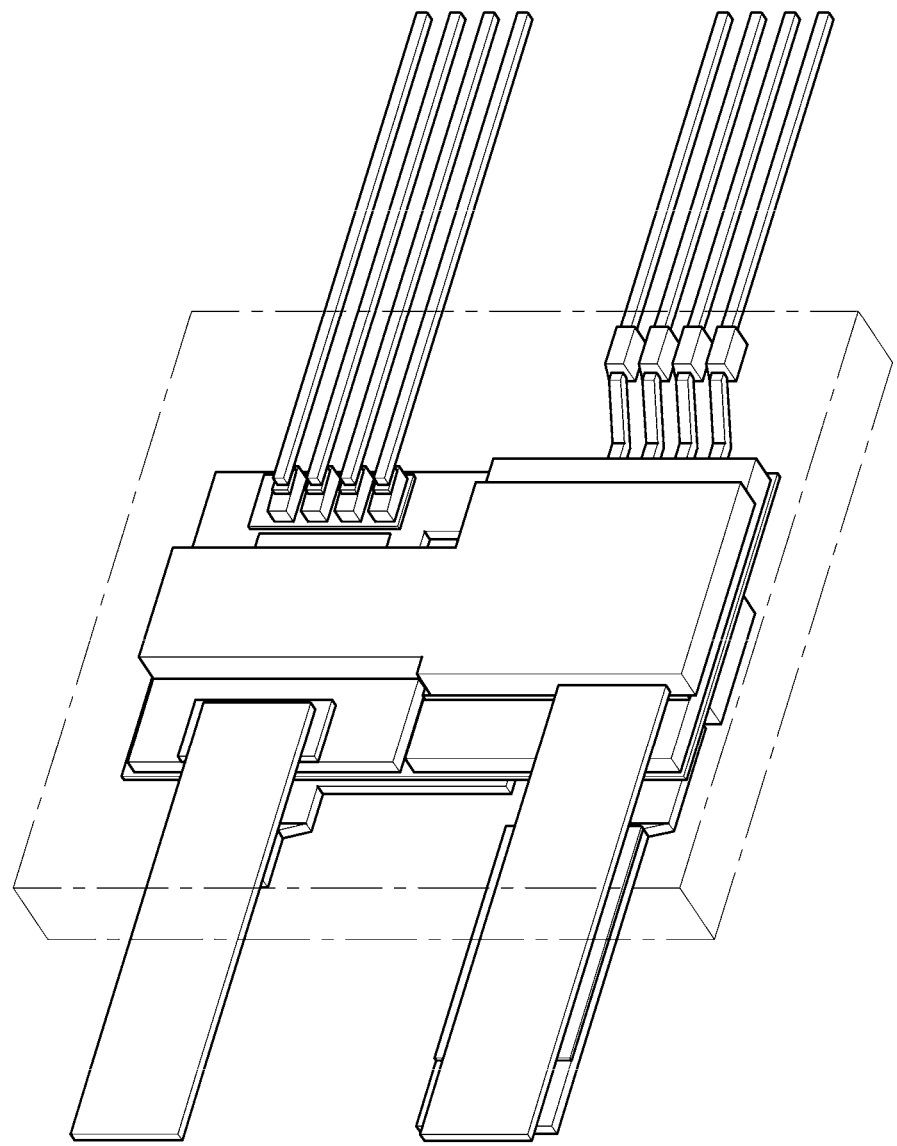

Subsequently, as shown in FIG. 11, the power module may be completed by separating and removing the predetermined regions of the upper lead frame 310 and the lower lead frame 320. Separating and removing the predetermined regions may be performed by removing the frame parts of the upper lead frame 310 and the lower lead frame 320 which are not necessary in the power module structure, and is a step of completing the final shape of the first lead part 31 and the second lead part 32 as shown in FIGS. 1 to 3.

Removing a part of the upper lead frame 310 and the lower lead frame 320 from unnecessary parts not required by the power module may be additionally performed as required before forming the mold part.

As described above, in the power module and the method of manufacturing the same according to the various exemplary embodiments of the present disclosure, by disposing power semiconductor devices on the upper and lower sides of the substrate provided with the dielectric layer, the parasitic inductance may be reduced by the dielectric layer disposed at the position between the metal layers when the current flows through the metal layers of the substrate. In addition, since the two power leads face each other by interposing the insulating layer between the two power leads supplying direct current power to the power module, there may be expected an effect in that the parasitic inductance is reduced by the insulating layer.

In addition, since the power semiconductor devices are disposed on the upper and lower sides of the substrate, sufficient space may be secured on the upper and lower sides of the power semiconductor device. Therefore, compared with the conventional power module that disposes the power semiconductor devices between both the substrates, the occurrence of interference between the bonding wires and the substrates may be eliminated, and the spacer for securing a distance between the two substrates may be removed.

In addition, in the conventional power module in which the power semiconductor devices are disposed between the two substrates, the second soldering is required after performing a process of the first soldering and wire bonding, and thus a problem of reducing reliability due to remelting of the solder occurs. However, in the power module and the method of manufacturing the same according to the various exemplary embodiments of the present disclosure, the number times soldering is performed may be reduced to one time, thereby eliminating the reduced reliability due to remelting, and reducing the process cost.

Although a preferred embodiment of the present disclosure has been described for illustrative purposes, those skilled in the art will appreciate that various modifications, additions and substitutions are possible, without departing from the technical scope and spirit of the disclosure as disclosed in the accompanying claims.

The invention claimed is:

1. A power module comprising:
a substrate having a dielectric layer;
a first power semiconductor device disposed on an upper part of the substrate;
a second power semiconductor device disposed on a lower part of the substrate;
a first lead part disposed on an upper part of the first power semiconductor device and electrically connected to the first power semiconductor device; and
a second lead part disposed on a lower part of the second power semiconductor device and electrically connected to the second power semiconductor device;
wherein, for receiving direct current voltage, the first lead part and the second lead part each comprise a first power lead and a second power lead, the first power lead and the second power lead are overlapped with each other vertically, and an insulating layer is interposed between the first power lead and the second power lead.

2. The power module of claim 1, wherein a portion of the first lead part and a portion of the second lead part are interconnected to make an electrical connection between the first power semiconductor device and the second power semiconductor device.

3. The power module of claim 1, wherein the substrate is provided with the dielectric layer, a first metal layer provided on an upper surface of the dielectric layer, and a second metal layer provided on a lower surface of the dielectric layer;
a portion between the first metal layer and the first power semiconductor device, a portion between the first metal layer and the first lead part, and a portion between the first power semiconductor device and the first lead part are electrically connected to each other by being soldered; and
a portion between the second metal layer and the second power semiconductor device, a portion between the second metal layer and the second lead part, and a portion between the second power semiconductor device and the second lead part are electrically connected to each other by being soldered.

4. The power module of claim 1, wherein the first lead part is provided with a first flat surface protruding upward and the second lead part is provided with a second flat surface protruding downward.

5. The power module of claim 4, further comprising:
a mold part integrally covering the substrate, the first power semiconductor device, the second power semiconductor device, a part of the first lead part, and a portion of the second lead part, wherein the first flat surface and the second flat surface are exposed toward outside from the mold part.

6. A method of manufacturing a power module, the method comprising:
providing a substrate having an upper lead frame, a lower lead frame, a first power semiconductor device, a second power semiconductor device, and a dielectric layer;
sequentially laminating and bonding the upper lead frame, the first power semiconductor device, the substrate, the second power semiconductor device, and the lower lead frame;
wire bonding between a first signal connection lead of the upper lead frame and signal terminals of the first power semiconductor device, and wire bonding between a second signal connection lead of the lower lead frame and signal terminals of the second power semiconductor device;
forming a mold part to cover a laminated structure formed through the bonding and a wire bonding part formed through the wire bonding; and
separating and removing a predetermined region of the upper lead frame and the lower lead frame to complete the power module.

7. The method of claim 6, wherein, during the bonding, a first power lead included in the upper lead frame and a second power lead included in the lower lead frame are vertically overlapped with each, between which direct current voltage is applied, and an insulating layer is interposed between the first power lead and the second power lead.

8. The method of claim 6, wherein, during the bonding, a part of the upper lead frame and a part of the lower lead frame are soldered to make an electrical connection between the first power semiconductor device and the second power semiconductor device.

9. The method of claim 6, wherein the mold part is formed such that at least a part of an upper surface of the upper lead frame and at least a part of a lower surface of the lower lead frame are to be exposed.

* * * * *